(12) United States Patent
Kizer et al.

(10) Patent No.: US 8,243,484 B2
(45) Date of Patent: Aug. 14, 2012

(54) ADJUSTABLE WIDTH STROBE INTERFACE

(75) Inventors: Jade M. Kizer, Durham, NC (US);
Yoshihito Koya, Kamakura (JP);
Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 270 days.

(21) Appl. No.: 12/532,914

(22) PCT Filed: Mar. 27, 2008

(86) PCT No.: PCT/US2008/004150
§ 371 (c)(1),
(2), (4) Date: Sep. 24, 2009

(87) PCT Pub. No.: WO2008/121376
PCT Pub. Date: Oct. 9, 2008

(65) Prior Publication Data
US 2010/0103713 A1    Apr. 29, 2010

Related U.S. Application Data

(60) Provisional application No. 60/921,094, filed on Mar. 30, 2007.

(51) Int. Cl.
*G11C 5/02* (2006.01)
(52) U.S. Cl. .............................. 365/51; 365/63; 365/193
(58) Field of Classification Search .................... 365/51, 365/63, 193, 230.03
See application file for complete search history.

(56) References Cited

U.S. PATENT DOCUMENTS

| | | | |
|---|---|---|---|
| 5,625,603 A * | 4/1997 | McClure et al. | 365/230.03 |
| 6,078,515 A | 6/2000 | Nielsen et al. | |
| 6,671,198 B2 * | 12/2003 | Takemura et al. | 365/63 |
| 2004/0037133 A1 | 2/2004 | Park et al. | |
| 2007/0058410 A1 | 3/2007 | Rajan | |

FOREIGN PATENT DOCUMENTS

| | | |
|---|---|---|
| GB | 2422963 | 8/2006 |
| WO | 2006023387 | 3/2006 |

OTHER PUBLICATIONS

International Search Report, PCT/US2008/004150.

\* cited by examiner

*Primary Examiner* — David Lam
(74) *Attorney, Agent, or Firm* — Mahamedi Paradice Kreisman LLP; Lance M. Kreisman

(57) ABSTRACT

A memory system comprises a circuit board 40 including N data signal lines 60, 65 and at least two strobe signal lines 70, 75, and first and second memory devices 50, 55 secured to opposing surfaces 40a, 40b of the circuit board. Each memory device is coupled to a portion of the N data signal lines and to a portion of the at least two strobe signal lines such that the devices do not share any of the N data signal lines and such that the devices do not share any of the strobe signal lines. The memory system further includes a controller 45 to communicate in parallel with the first and second memory devices through the N data signal lines and the at least two strobe signal lines.

12 Claims, 7 Drawing Sheets

ADJUSTABLE WIDTH STROBE INTERFACE

CROSS-REFERENCE TO RELATED APPLICATIONS

This application claims the benefit of the filing date of U.S. Provisional Patent Application No. 60/921,094 filed Mar. 30, 2007, the disclosure of which is incorporated herein by reference.

BACKGROUND OF THE INVENTION

Modern digital systems typically include one or more memory devices that are accessed through a memory controller. In a common application, the memory device(s) and memory controller reside on a printed circuit board (PCB), and the memory device(s) are coupled to the memory controller via one or more PCB signal lines.

In some applications, a memory system may include more than one (e.g., two) memory devices that are coupled to a memory controller via the PCB signal lines, with a first memory device on the same side of the PCB as the memory controller, and a second memory device on an opposite side of the PCB. The second memory device "mirrors" the first memory device and shares the PCB signal lines with the first memory device. The PCB signal lines may include signal lines for conveying data signals, signal lines for conveying strobe signals, and signal lines for conveying command/address (CA) signals between the controller and the memory devices.

The memory system is said to be an "N-bit wide" system when data is written to the memory devices and/or read from the memory devices "N-bits" at a time. Thus, the memory devices in such a system may be denoted as "by N" or "xN" memory devices. For example, the system may be a "byte-wide" system (N=8) in which data is transferred in 8-bit parallel fashion, and the memory devices are "x8" devices. During a write operation, a memory address is provided to indicate the desired destination of the data to be written (i.e. desired device and desired intra-device location). Once the desired destination is identified, N-bits of data are transmitted from the controller to the desired destination in the form of N parallel write-data signals. The N write-data signals are conveyed from the controller to the desired destination by respective ones of N data signal lines. In addition, a write strobe signal corresponding to the N bits is provided to the addressed memory device by way of a strobe signal line. The write strobe signal provides timing information to insure that the N data signals are correctly sampled at the destination.

During a read operation, a memory address is provided to indicate the memory location to be read. Once the location is identified (desired device and desired intra-device location) the N bits of data are transmitted from the memory location to the controller in the form of N parallel read-data signals. The N read-data signals are conveyed from the memory location to the controller by respective ones of the N data signal lines. In addition, a read strobe signal is provided to the controller by way of the strobe signal line. The read strobe signal provides timing information to insure that the N data signals are correctly sampled at the controller.

The timing of the strobe signal is critical for both write and read operations. In a write operation, the arrival of the write strobe signal at the addressed device may need to be synchronized with the arrival of the write-data signals such that the write-data signals are correctly sampled. In a read operation, the arrival of the read strobe signal at the controller may need to be synchronized with the arrival of the read-data signals such that the read-data signals are correctly sampled.

BRIEF DESCRIPTIONS OF THE DRAWINGS

The following detailed description given by way of example, but not intended to limit the invention solely to the specific embodiments described, may best be understood in conjunction with the accompanying drawings wherein like reference numerals denote like elements and parts, in which.

DETAILED DESCRIPTION

It has been recognized that in mirrored memory systems, the use of a strobe signal line shared among more than one memory device complicates the synchronization of the strobe signal with the corresponding data signal.

Further, it has been recognized that in a mirrored configuration, vias through the PCB are often required to allow sharing of strobe and/or data signal lines between the memory devices. Compared to a memory system with a single "non-mirrored" memory device, the parasitic capacitance that develops across each via shared by the two memory devices in a mirrored system tends to cause more corruption of the signals transmitted to/from the memory devices.

For the sake of brevity, the embodiments are described in the context of a memory system that includes a memory controller and one or two memory devices. Nevertheless, upon studying the present disclosure, one skilled in the art will readily appreciate how the described embodiments may be implemented in contexts other than the illustrative memory systems described herein.

Figure 1:
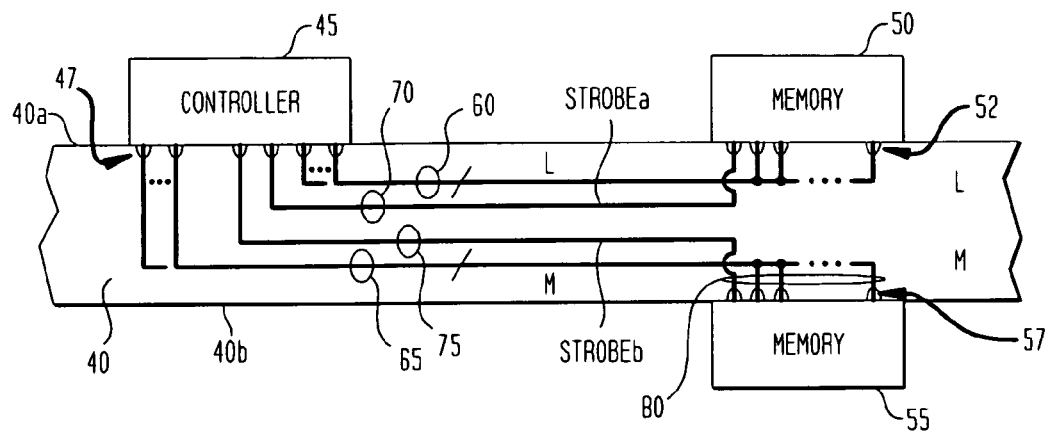
FIG. 1 is a block diagram of a memory system in accordance with an embodiment.

Referring now to FIG. 1, there is shown a block diagram of a memory system 10 in accordance with an embodiment. Memory system 10 includes a PCB 40, a memory controller 45, a first memory device 50, and a second memory device 55. The PCB is shown in profile, with an exaggerated thickness, and includes a top surface 40a and a bottom surface 40b. The memory controller and first memory device reside on the top surface of the PCB. The second memory device resides on the bottom surface of the PCB. The PCB includes a first group of L data signal lines 60, a second group of M data signal lines 65, where L+M=N and L, M, and N are positive integers. In one embodiment, L=M=N/2. The PCB further includes at least one first strobe signal line 70 and at least one second strobe signal line 75. The controller has multiple contacts 47 through which the controller is coupled to respective ones of the strobe signal lines 70 and 75 and data signal lines 60 and 65. Memory device 50 has multiple contacts 52 through which the memory device is coupled to respective ones of the at least one strobe signal line 70 and the data signal lines 60. Memory device 55 has multiple contacts 57 through which the memory device is coupled to respective ones of the at least one strobe signal line 75 and the data signal lines 65. Thus, the two memory devices do not share any strobe signal line or data signal line. Some or all of the strobe signal lines and/or data signal lines may lie between the top and bottom surfaces of the PCB, and the PCB may include a plurality of vias coupling respective strobe and/data signal lines to the corresponding contacts on the memory devices 50 and 55.

For purposes of clarity of presentation, the strobe signal lines and data signal lines of FIG. 1 are depicted as lines that exist between the top and bottom surfaces of the PCB. Moreover, the lines are depicted as not lying in a single plane that is parallel to the top or bottom surface of the PCB. The strobe signal lines and data signal lines for each of the memory devices may, however, lie in a single plane that is parallel to the top or bottom surface of the PCB and that is at or near either the top or bottom surface of the PCB. Further, the vias are depicted as lines that run from the interior of the PCB to the top or bottom surface of the PCB. Each via may, however, be a through via running from the top surface of the PCB to the bottom surface of the PCB while only coupling to one data or strobe contact on either memory device 50 or memory device 55. A via may be formed as a hole which is plated with conductive material so as to provide a conductive path between different layers or surfaces of the PCB.

The system of FIG. 1 is an "N-bit wide" system. That is, data may be written to the memory devices and read from the memory devices in "N-bit" parallel fashion. However, in the FIG. 1 system, a single read or write operation involves the parallel transfer of L (e.g., N/2) bits of data to/from the first memory device and M (e.g., N/2) bits of data to/from the second memory device (the "second N/2 bits). Further, in the FIG. 1 system, a single read or write operation involves the generation of at least two strobe signals, at least one strobe signal corresponding to the L bits of data associated with the first memory device and at least one strobe signal corresponding to the M bits associated with the second memory device.

During a read or write operation, at least one memory address is provided. The address indicates the desired destination, within each memory device, where the data is to be read from or written to. More specifically, the address indicates the destination within the first device where the L bits are to be written/read and the destination within the second device where the M bits are to be written/read. In one embodiment, the address indicates corresponding intra-device locations in the two memory devices. For example, an address value of "3" indicates the "3$^{rd}$" memory location within the first memory device and the "3$^{rd}$" memory location within the second memory device.

During a write operation, once the address is provided, the N-bits of data are transmitted from the controller to the desired destination in the form of N write-data signals. The N write-data signals are conveyed from the controller to the desired destinations by respective ones of the N data signal lines. That is, L write-data signals are conveyed from the controller to the desired destination within the first memory device by respective ones of the data signal lines 60, and M write-data signals are conveyed from the controller to the desired destination within the second memory device by respective ones of the data signal lines 65. In addition, at least one first strobe signal corresponding to the L bits is provided to the first memory device by way of the at least one first strobe signal line, and at least one second strobe signal corresponding to the M bits is provided to the second memory device by way of the at least one second strobe signal line. The strobe signals provide timing information to insure that the N data signals are correctly sampled at the destinations.

During a read operation, once the address is provided, the N-bits of data are transmitted from the addressed locations within the memory devices to the controller. The N bits of data are transferred in the form of N read-data signals. The N read-data signals are conveyed from the memory devices to the controller by respective ones of the N data signal lines. That is, L read-data signals are conveyed from the desired location within the first memory device to the controller by respective ones of the data signal lines 60, and M read-data signals are conveyed from the desired location within the second memory device to the controller by respective ones of the data signal lines 65. In addition, at least one first strobe signal corresponding to the L bits is provided from the first memory device to the controller by way of the at least one first strobe signal line, and at least one second strobe signal corresponding to the M bits is provided from the second memory device to the controller by way of the at least one second strobe signal line.

By associating each memory device with its own dedicated strobe signal(s), the system of FIG. 1 overcomes the problems inherent in synchronizing a mirrored memory system in which memory devices share strobe signal(s).

In one embodiment, memory devices 50 and 55 are both N/2 wide, so L=M=N/2. However, the embodiments are not limited to N-bit transfers conducted in the context of two groups having N/2 bits each. For example, in mirrored embodiments N-bit transfers may be conducted in two groups wherein each group includes a number of bits in the range of 1 bit to N−1 bits, with the total number of bits in the two groups adding up to N.

Figure 2:
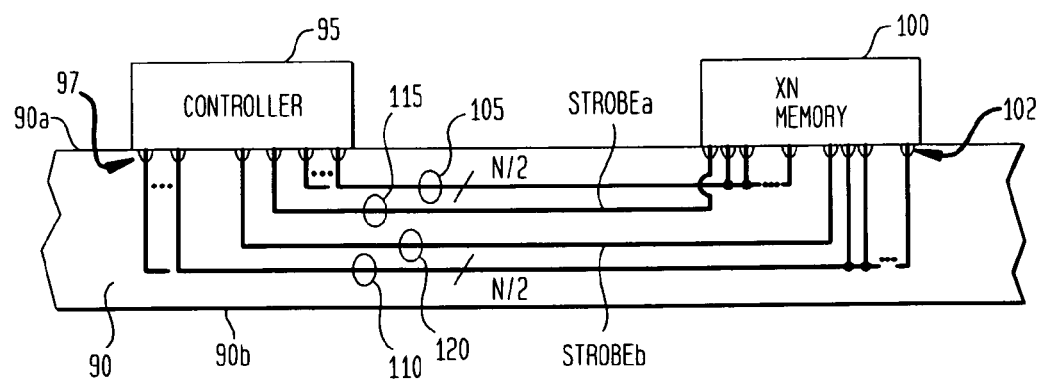
FIG. 2 is a block diagram of a memory system in accordance with an embodiment.

FIG. 2 is a block diagram of a memory system 20 including a PCB 90, a memory controller 95, and a memory device 100. The PCB is shown in profile, with an exaggerated thickness, and includes a top surface 90a and a bottom surface 90b. The memory controller and memory device reside on the top surface of the PCB. The PCB includes a first group of "N/2" data signal lines 105, a second group of "N/2" data signal lines 110, at least one first strobe signal line 115, and at least one second strobe signal line 120. ("N" being an integer greater than or equal to 1). The controller has multiple contacts 97 through which the controller is coupled to respective ones of the strobe signal lines 115 and 120 and data signal lines 105 and 110. Memory device 100 has multiple contacts 102 through which the memory device is coupled to respective ones of the strobe signal lines and data signal lines.

For purposes of clarity of presentation, the strobe signal lines and data signal lines of FIG. 2 are depicted as lines that exist between the top and bottom surfaces of the PCB. Moreover, the lines are depicted as not lying in a single plane that is parallel to the top or bottom surface of the PCB. Some or all of the strobe signal lines and data signal lines may, however, lie in a single plane that is parallel to the top or bottom surface of the PCB and that is at or near either the top or bottom surface of the PCB.

The system 20 of FIG. 2, like the system 10 of FIG. 1, is an "N-bit wide" system. Data is written to the memory device and read from the memory device "N-bits" at a time. As in the FIG. 2 system, two sets of strobe signals are used, at least one first strobe signal conveyed on strobe signal line(s) 115 and corresponding to N/2 bits conveyed on data signal lines 105, and at least one second strobe signal conveyed on strobe signal line(s) 120 and corresponding to the N/2 bits conveyed on data signal lines 110.

It should be noted that the embodiment of FIG. 2 is not limited to N-bit transfers conducted in the context of two groups having N/2 bits each. For example, N-bit transfers may be conducted in two groups wherein each group includes a number of bits in the range of 1 bit to N−1 bits, with the total number of bits in the two groups adding up to N.

It should be further noted that, each of memory devices 50, 55 and 100 may include an integrated circuit chip in an integrated circuit package. In one embodiment, the memory chips in the memory devices 50, 55, 100 are identically or similarly configured, although the memory devices 50, 55, 100 may differ from each other due to the memory chips being packaged differently to form the memory devices 50, 55, 100.

Figure 3:
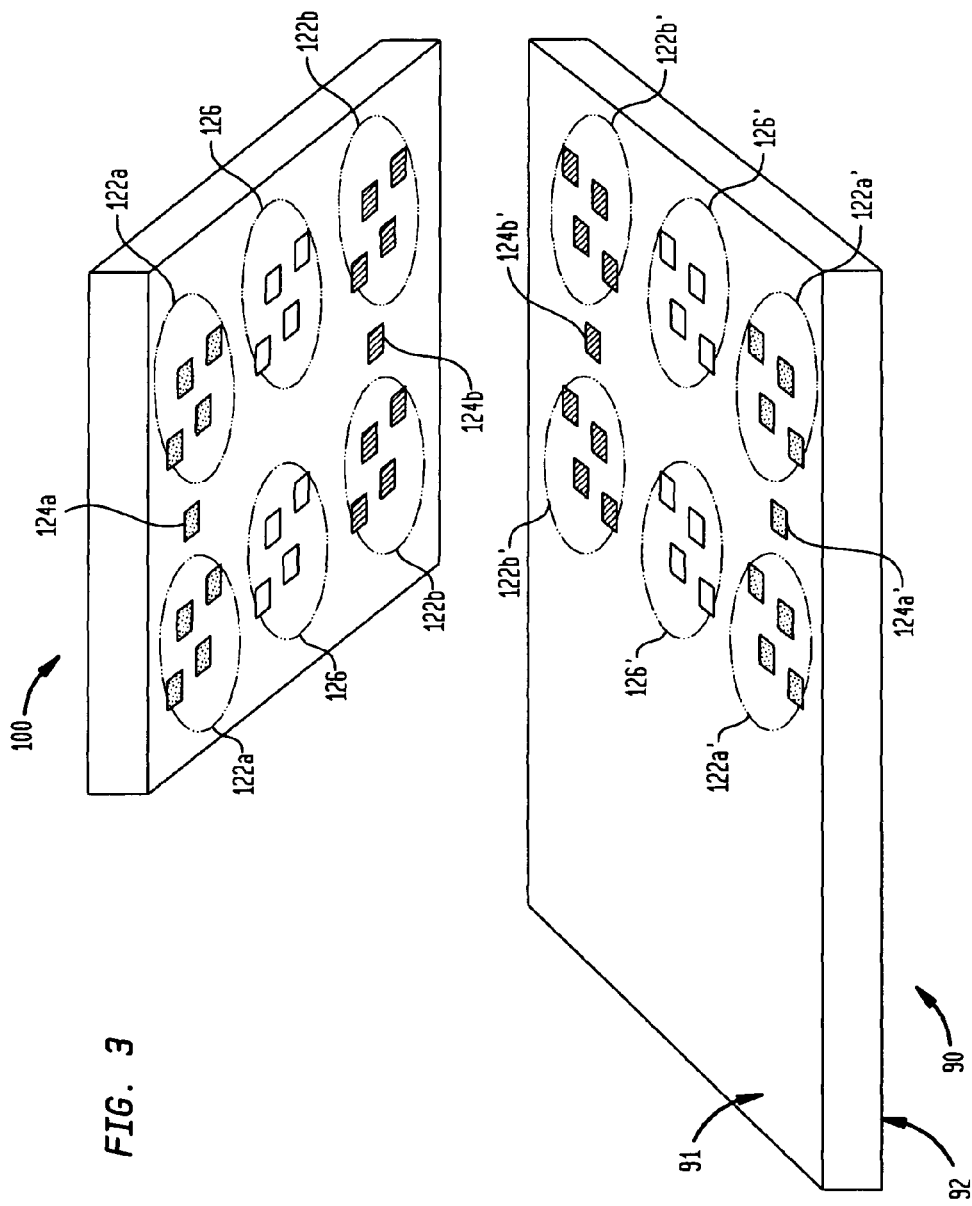
FIG. 3 is a three-dimensional representation of an embodiment of the memory device shown in FIG. 2 and a portion of an embodiment of the printed circuit board (PCB) shown in FIG. 2.

FIG. 3 is a three-dimensional representation of an embodiment of the memory device 100 shown in FIG. 2 and a portion of an embodiment of the printed circuit board (PCB) 90 shown in FIG. 2. In FIG. 3, the memory device and PCB are placed apart from each other in order to expose their contacting surfaces. For ease of illustration, memory device 100 is shown as a x16 device (N=16) having 256 addressable memory locations. But the description below can be easily scaled to be applicable to memory devices having wider or narrow widths. As can be seen from the figure, the memory device includes 16 data contacts in the form of two sets of contacts, a first set 122a and a second set 122b. Two strobe contacts 124a and 124b are provided and correspond respectively to the first and second set of data contacts. Further, 8 address contacts 126 are provided.

The PCB of FIG. 3 includes 16 data contacts in the form of two sets of 8 contacts, a first set 122a' and a second set 122b'. Two strobe contacts 124a' and 124b' are provided and correspond respectively to the first and second sets of data contacts. Further, 8 address contacts 126' are provided. When the memory device is mated to the PCB, data contacts 122a on the memory device mate with data contacts 122a' on the PCB, data contacts 122b mate with data contacts 122b', strobe contact 124a mates with strobe contact 124a', strobe contact 124b mates with strobe contact 124b', and address contacts 126 mate with address contacts 126'. In this manner signals may be passed between the memory device and PCB.

In the FIG. 3 embodiment, the signal lines of the PCB lie beneath the PCB's top surface 90a. Accordingly, the signal lines are not shown in FIG. 3. Nevertheless, it is noted that the PCB of FIG. 3 includes a signal line for each of the PCB contacts.

In one embodiment, the memory chips in the memory devices in FIGS. 1 and 2 are dynamic point-to-point (DPP) type integrated circuit memory chip having two sets of memory storage cells and two sets of data contact pads-corresponding to the two sets of memory device storage cells. Each memory chip has multiplexing logic that sets the internal configuration of the memory chip to either a first configuration or a second configuration. In the first configuration, the memory device transfer information for the first set of storage cells through the first set of data pads and transfer information for the second set of storage cells through the second set of data pads. In the second configuration, the memory device transfer information for the first and second sets of storage cells through only the first set of data pads, leaving the second set of data pads unused.

In the FIG. 1 embodiment, each of memory devices 50 and 55 is configured to transfer information of the first and second sets of storage cells through only the first set of data pads, leaving the second set of data pads unused. Thus, while the memory chip in each of the devices can be a "xN" memory chip, only N/2 data pads of each memory chip are used.

In the FIG. 2 embodiment, the memory chip in the memory device 100 is configured to transfer information of the first and second set of storage cells through respective ones of the first and second sets of data pads.

Among the advantages of using DPP memory chips in the embodiments is the flexibility that DPP memory chips provide. For example, a DPP-type memory chip like those used in system 10 of FIG. 1 can also be used in system 20 of FIG. 2.

Figure 4:
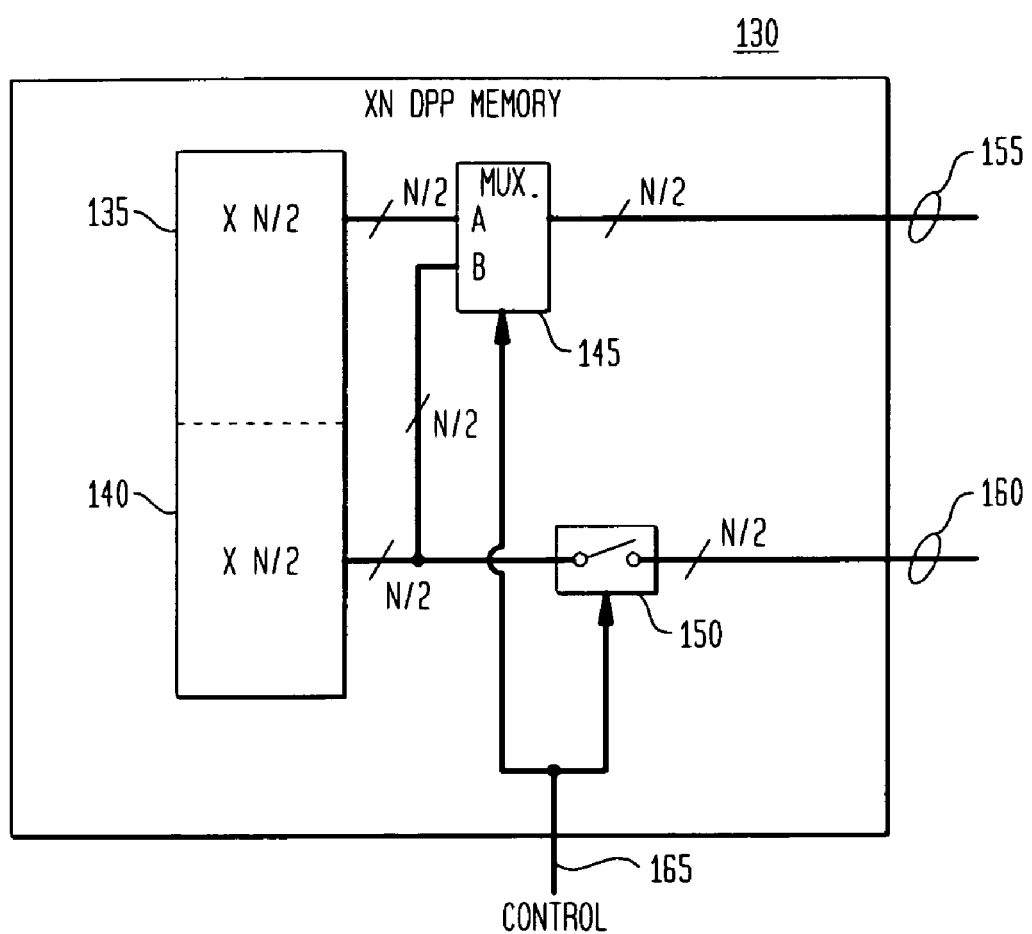
FIG. 4 is a block diagram of a dynamic point-to-point memory device suitable for use with the embodiments.

FIG. 4 is a block diagram of a dynamic point-to-point memory chip 130 suitable for use with the embodiments. The chip of FIG. 4 is a "xN" DPP memory chip, meaning that the chip can be accessed N-bits at a time ("wide-mode operation") or N/2 bits at a time ("narrow-mode operation"). As can be seen from FIG. 4, the chip includes two sets of memory cells, a first set of memory cells 135 and a second set of memory cells 140. Each of the sets of memory cells is denoted as being "xN/2", meaning that each set is accessed N/2 bits at a time. The chip 130 further includes a multiplexer 145, a switch 150, a first set of data pads 155, a second set of data pads 160, and a control signal input 165. In the narrow-mode of operation, the device transfers information of the first and second sets of storage cells through only the first set of data pads 155. In order to operate the device in the narrow mode, a narrow-mode control signal is supplied to the control signal input. In response to the narrow-mode control signal, switch 150 opens and multiplexer 145 selectively couples its inputs (A and B) to the first group of data pads 155. The selective coupling performed by the multiplexer may be performed in response to, for example, the most significant address bit in an address signal.

In order to operate the device of FIG. 4 in the wide mode, a "wide-mode" control signal is supplied to the control signal input. In response to the wide-mode control signal, switch 150 closes and multiplexer 145 couples its input A to the first group of data pads 155. In the wide mode of operation, information of the first set of storage cells is transferred through the first set of data pads 155 and information of the second set of storage cells is transferred through the second set of data pads 160.

Figure 5:
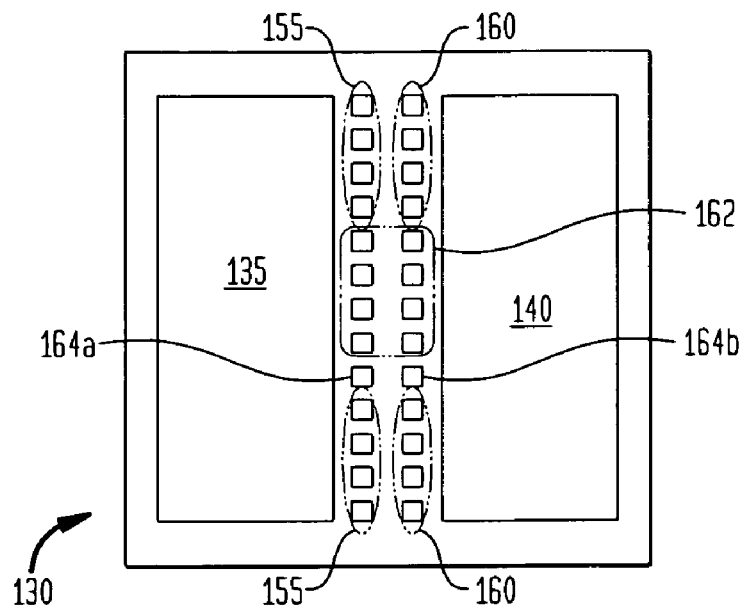
FIG. 5 is a plan view of an embodiment of the memory device of FIG. 4.

In an embodiment, the DPP chip 130 of FIG. 4 is 16 bit wide (N=16) and is configured as shown in FIG. 5. As can be seen from FIG. 5, the chip 130 includes the first set of memory cells 135, the second set of memory cells 140, the first set of 8 data pads 155, the second set of 8 data pads 160, 8 address pads 162, and strobe pads 164a and 164b. Data pads 155 correspond to the first set of memory cells 135, and data pads 160 correspond to the second set of memory cells 140. The address pads are shared by the first and second set of memory cells. The strobe signals 164a and 164b correspond respectively to the first and second set of memory cells, strobe pad 164a conveying strobe signals that provide timing information for data conveyed via data pads 155, and strobe pad 164b conveying strobe signals that provide timing information for data conveyed via data pads 160.

The DPP chip of FIG. 4 may be employed in the embodiment of FIG. 1. More specifically, two DPP chips of the type shown in FIG. 4 may serve as the memory chips in the memory devices 50 and 55 of FIG. 1. In such an implementation, each of the DPP memory devices 50 and 55 is configured to transfer information of the first and second sets of storage cells through only the first set of data pads, leaving the second set of data pads unused. That is, each of the DPP memory devices is configured to operate in the narrow mode.

The DPP chip of FIG. 4 may also be employed in the embodiment of FIG. 2. More specifically, a DPP chip of the type shown in FIG. 4 may serve as the memory chip in the memory device 100 of FIG. 2. In such an implementation, the DPP memory device 100 is configured to transfer information of the first set of storage cells through the first set of data pads and transfer information of the second set of storage cells through the second set of data pads. That is, each of the DPP memory devices is configured to operate in the wide mode.

Figure 6:
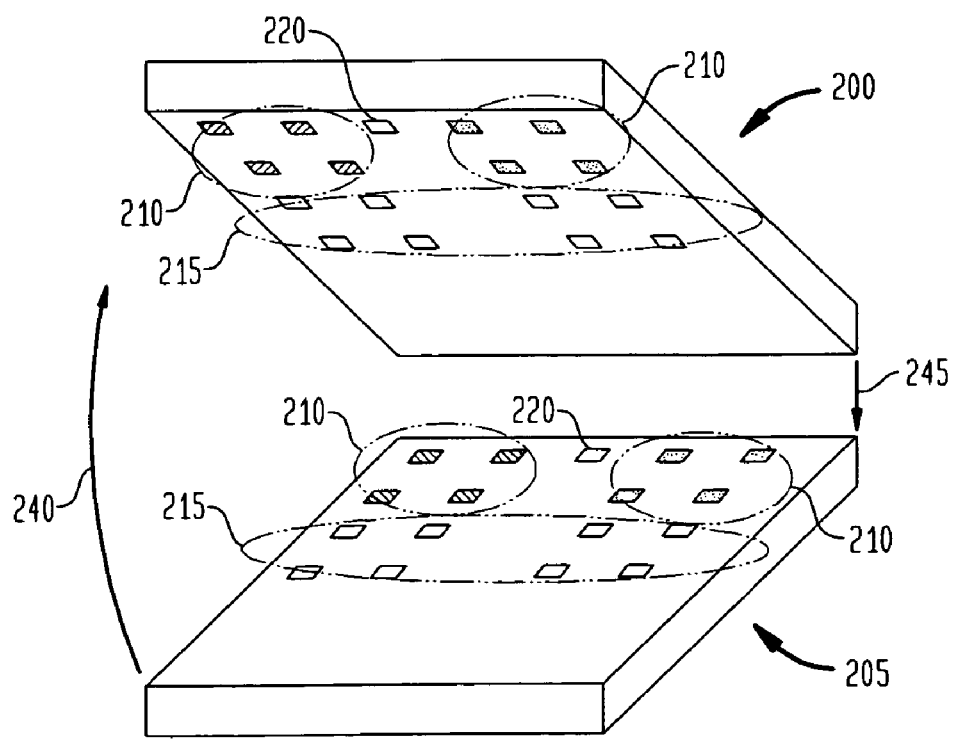
FIG. 6 is a three-dimensional representation of an embodiment of the memory devices in FIG. 1.

FIG. 6 is a three-dimensional representation of a first memory device 200 and a second memory device 205 in accordance with an embodiment. The devices can be the same. Two devices are shown for purposes of explaining how the devices are employed in a system such as system 10 shown in FIG. 1. As can be seen from FIG. 6, a "bottom" surface of each memory device has eight data contacts 210 for coupling the device to data signal lines, eight address contacts 215 for coupling the device to address signal lines, and a strobe contact 220 for coupling the device to a strobe signal line.

For each device, the strobe contact conveys write-data strobe signals when data is being written to the device, and conveys read-data strobe signals when data is being read from the device. However, it should be noted that alternative embodiments employ separate signal lines for the write-data strobe signals and read-data strobe signals. Accordingly, in an alternative embodiment each memory device of FIG. 6 includes two strobe contacts, one for write-data strobe signals and one for read-data strobe signals. A memory device of the type shown in FIG. 6 and a memory device of the type shown in FIG. 3 may be formed using the same integrated circuit chip, such as the one shown in FIGS. 4 and 5. That is, the differences between the two types of devices can be realized entirely through the packaging of the integrated circuit chip. More specifically, the device of FIG. 3 can be formed by placing an integrated circuit chip having 16 data pads, 8 address pads, and 2 strobe pads in a package that allows for the bonding out of the 16 data pads, 8 address pads, and 2 strobe pads to the 16 data contacts 122, 16 address contacts 126, and 2 strobe contacts 124 shown in FIG. 3, respectively. The device of FIG. 6 can be formed by placing the same integrated circuit chip in a package that allows for the bonding out of only 8 data contacts, 8 address contacts and one strobe contact to the 8 data contacts 210, 8 address contacts 215, and 1 strobe contact 220 shown in FIG. 6, respectively.

The devices of FIG. 6 can be used as the memory devices 50 and 55 in an embodiment of system 10 of FIG. 1. In particular, the devices of FIG. 6 can be used in an embodiment of FIG. 1 when L=M=N/2 and N=16. In such embodiment, the data contacts of memory device 200 (i.e. "the top device") would be coupled to data signal lines 60, and the strobe contact of memory device 200 would be coupled to strobe signal line 70. The data contacts of memory device 205 (i.e. "the bottom device") would be coupled to data signal lines 65, and the strobe contact of memory device 205 would be coupled to strobe signal line 75. The address contacts of the devices would share address signal lines (not shown in FIG. 1).

When used in the embodiment of FIG. 1, the contact positions of the FIG. 6 devices provide for a reduction or elimination of parasitic capacitance appearing across the vias shared by two memory devices in conventional mirrored memory systems. The reduction/elimination of parasitic capacitance and its corresponding noise components is clearly understood with reference to FIG. 6.

As can be seen from FIG. 6, the data and strobe contact positions of memory devices 200 and 205 do not overlap when the devices are both employed in system 10. That is, when memory device 200 is placed directly over or under memory device 205 with the PCB board between them, they overlap with each other but their data contacts do not overlap when viewed from a direction generally perpendicular to a plane in which the circuit board is positioned, meaning no data contact of memory device 200 is directly over or under a data contact of memory device 205. The relative positions of the two devices' in such a configuration is depicted by arrows 240 and 245. In one embodiment, as shown in FIG. 6, when the two devices are used in system 10, the data and strobe contacts of device 200 overlie an area on device 205 not occupied by data contacts and the data and strobe contacts of device 205 overlie an area on device 200 not occupied by data contacts. Since the data and strobe contacts of the two devices do not overlap, it is less likely that a capacitance will develop between any data or strobe contact on device 200 and any data or strobe contact on device 205.

In one embodiment, PCB 90 in FIG. 3 can be used with devices 200 and 205 to form system 10 in FIG. 1. In this case, the data, strobe, and address contacts 122, 124, and 126 on a top surface 91 of PCB 90 are coupled to respective data, strobe and address contacts (not shown) on a bottom surface 92 of PCB 90 by vias (not shown) through the PCB. Memory device 200 is coupled to a portion of the data and strobe contacts 122, 124, and 126 on the top surface 91 while memory device 205 is coupled to a portion of the data and strobe on the bottom surface 92 of the PCB. The data and strobe contacts coupled to the memory device 200 are not coupled to the data and strobe contacts that are coupled to the memory device 205. Thus, the same PCB board 90 can be used to build either system 10 or system 20.

Figure 7A:
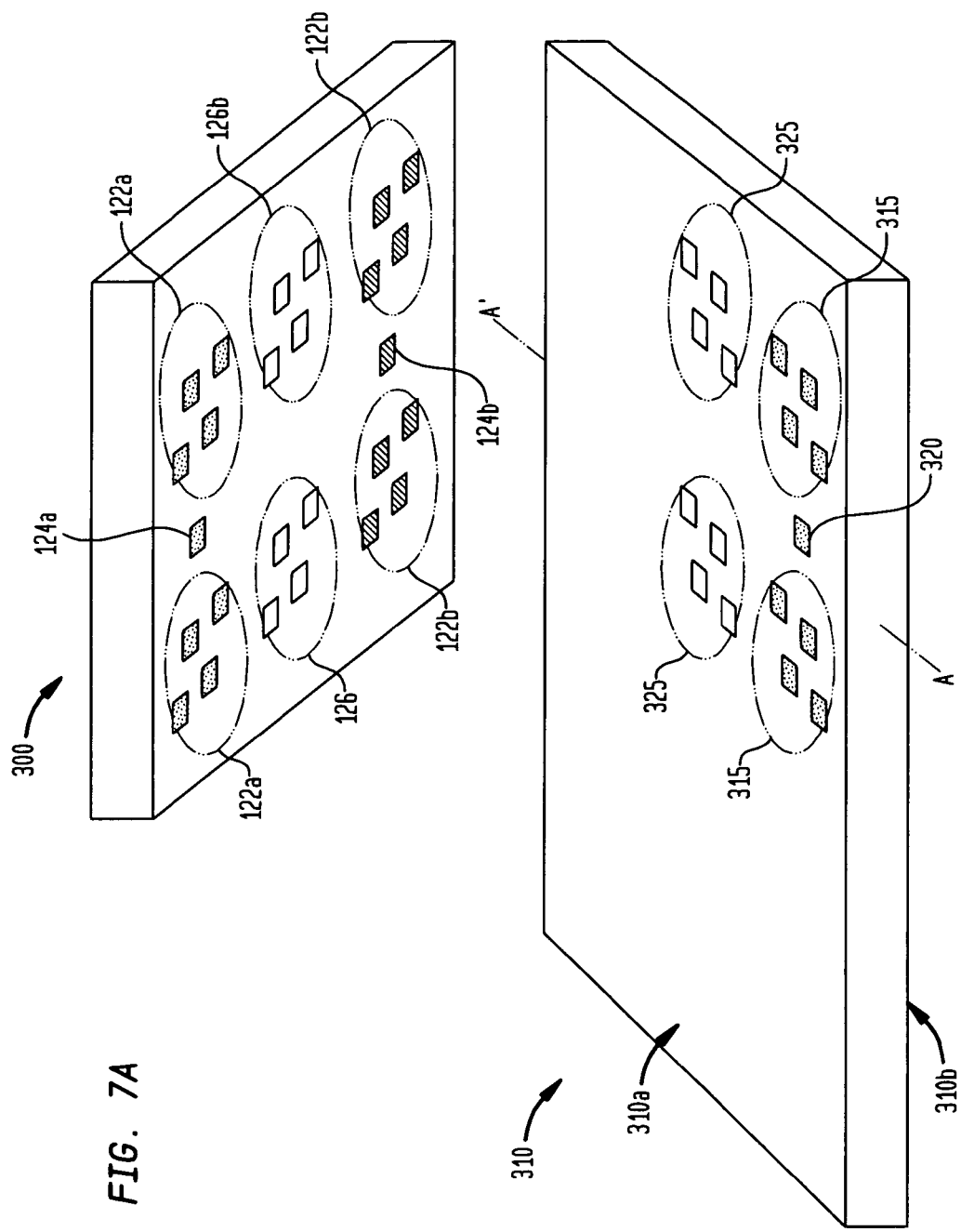
FIGS. 7A and 7B are three-dimensional representations of a mirrored memory system in accordance with an embodiment.
Figure 7B:
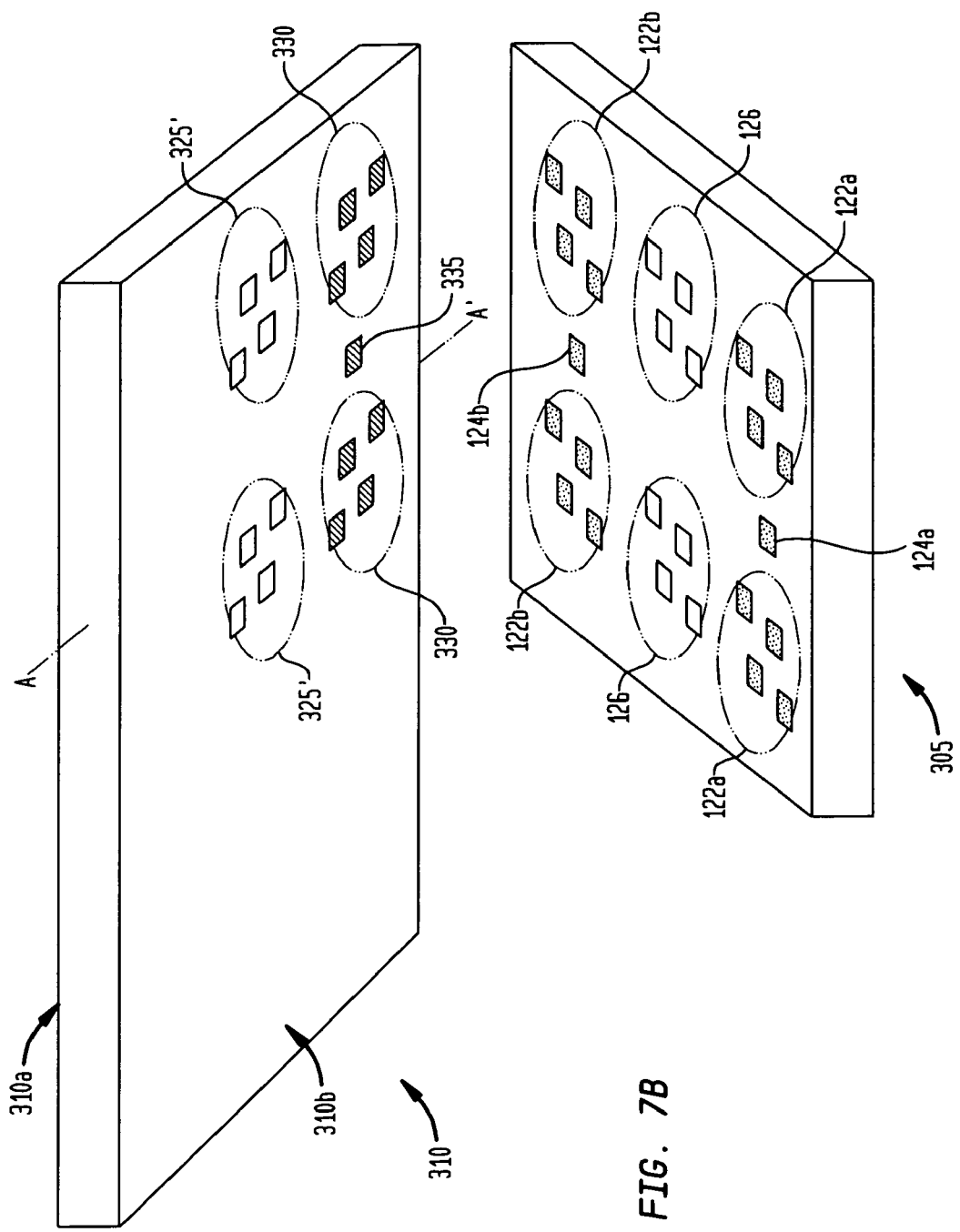

In other embodiments, a PCB having back-drilled vias is used to reduce parasitic capacitance in system 10. For example, two memory devices of the type shown in FIG. 3 and/or FIG. 6 can be used with such a PCB to form system 10 with reduced parasitic capacitance. FIGS. 7A and 7B are three-dimensional representations of an example of system 10 in accordance with an embodiment that employs a PCB having back-drilled vias.

As can be seen from FIGS. 7A and 7B, the memory system includes a "top" memory device 300, a bottom memory device 305, and a PCB 310. In the depicted implementation, the memory devices are identically or similarly configured and may be the same as the memory device shown in FIG. 3. Accordingly, in one example, the memory devices each include a "bottom" surface having 16 data contacts 122a and 122b, two strobe contacts 124a and 124b, and 8 address contacts 126.

Figure 8:
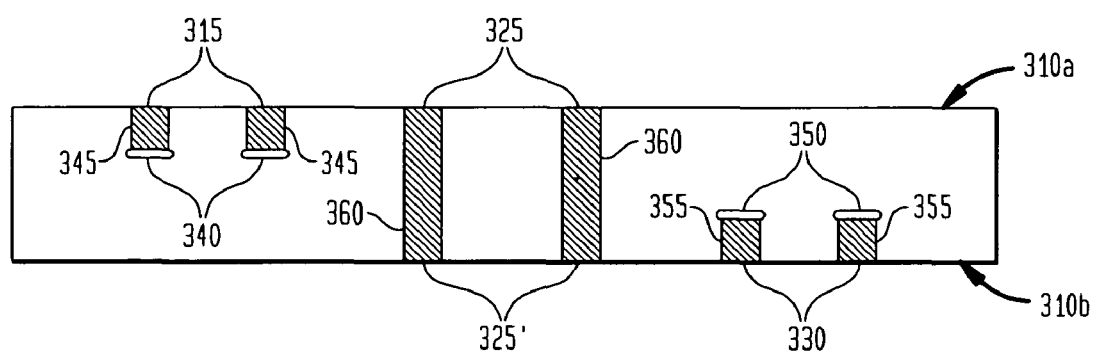
FIG. 8 is a cross-section of a PCB having back-drilled vias suitable for use in the memory system depicted in FIGS. 7A and 7B.

Only a portion of the PCB is depicted in FIGS. 7A and 7B. The PCB has a "top" surface 310a and a "bottom" surface 310b. The top surface of the PCB includes 8 data contacts 315, a strobe contact 320, and 8 address contacts 325. The bottom surface of the PCB includes 8 data contacts 330, a strobe contact 335, and 8 address contacts 325'. A cross-section of the PCB as taken along line AA' is shown in FIG. 8. As can be seen from FIG. 8, data contacts 315 of the top surface are coupled to respective data signal lines 340 through respective back-drilled vias 345. Similarly, data contacts 330 of the bottom surface are coupled to respective data signal lines 350 through respective back-drilled vias 355. The address contacts of the top surface 325 and the address contacts of the bottom surface 325' are respectively coupled to each other by respective through-vias 360.

The data signal lines 340 and 350 are located in the interior of the PCB and are shown in cross-section in FIG. 8. The address signal lines (not shown in FIG. 8) may be located in the interior of the PCB, at the top surface of the PCB, at the bottom surface of the PCB, or at both the top and bottom surfaces of the PCB.

When the memory system depicted in FIGS. 7A, 7B and 8 is assembled, data contacts 122a of the top memory device mate with data contacts 315 of the top surface of the PCB, strobe contact 124a of the top memory device mates with strobe contact 320 of the top surface of the PCB, and address contacts 126 of the top memory device mate with address contacts 325 of the top surface of the PCB. Similarly, data contacts 122b of the bottom memory device mate with data contacts 330 of the bottom surface of the PCB, strobe contact 124b of the bottom memory device mates with strobe contact 335 of the bottom surface of the PCB, and address contacts 126 of the bottom memory device mate with address contacts 325' of the bottom surface of the PCB. Thus, the data contacts and strobe contact of the top memory device are vertically aligned with the data contacts and strobe contact of the bottom memory device. However, no data contact or strobe contact of either memory device is coupled to its counterpart in the other memory device. Thereby, reducing parasitic capacitance.

It should be noted that the numbers of data contacts, strobe contacts and address contacts included in the system of FIGS. 7A, 7B and 8 are merely illustrative. For example, memory device 300 or 305 is shown as a x16 device (N=16). But the description associated with it can be easily scaled to be applicable to memory devices having wider or narrow widths. Further, it should be noted that the particular geometry of the shape and arrangement of the contacts depicted in the Figures is merely illustrative. Upon viewing this disclosure, one skilled in the art will readily appreciate the wide range of contact configurations suitable for the embodiments.

As these and other variations and combinations of the features discussed above can be utilized without departing from the present invention as defined by the claims, the foregoing description of the one embodiments should be taken by way of illustration rather than by way of limitation of the invention as defined by the claims

The invention claimed is:

1. A memory device, comprising:
   a plurality of data contacts distributed on a surface of the memory device, the plurality of data contacts being arranged such that when a first such memory device is positioned on a first surface of a circuit board and coupled to a first plurality of signal lines of the circuit board through its respective data contacts, a second such memory device can be placed on a second surface of the circuit board and coupled to a second plurality of signal lines of the circuit board through its respective data contacts such that the first memory device is directly over the second memory device and such that no data contact of the first memory device is directly over a data contact of the second memory device.

2. The memory device as recited in claim 1, further comprising a plurality of strobe contacts being arranged such that when a first such memory device is positioned on a first surface of a circuit board and coupled to a first plurality of strobe lines of the circuit board through its respective strobe contacts, a second such memory device can be placed on a second surface of the circuit board and coupled to a second plurality of strobe lines of the circuit board through its respective strobe contacts such that the first memory device is directly over the second memory device and such that no strobe contact of the first memory device is directly over a strobe contact of the second memory device.

3. The memory device as recited in claim 1, further comprising a plurality of address contacts for coupling the memory device to address signal lines, the address contacts being arranged such that when a first such memory device is positioned on a first surface of a circuit board, a second such memory device can be placed on a second surface of the circuit board such that the first memory device is directly over the second memory device and such that each address contact of the first memory device is directly over an address contact of the second memory device.

4. The memory device as recited in claim 1, wherein the data contacts are further arranged such that the data contacts of the first memory device are directly over an area of the second memory device not occupied by any data contacts.

5. A memory device, comprising:
   an integrated circuit packaging substrate;
   an integrated circuit memory chip secured to the packaging substrate and having a plurality of data pads; and
   a plurality of data contacts attached to the integrated circuit packaging substrate, the plurality of data contacts being fewer in number than the plurality of data pads so that a first portion of the plurality of data pads are coupled to respective ones of the plurality of data contacts and that a second portion of the plurality of data pads are not coupled to any data contact of the memory device.

6. The memory device as recited in claim 5, wherein the data contacts being arranged such that when a first such memory device is positioned on a first surface of a circuit board and coupled to a first plurality of signal lines of the circuit board through its respective data contacts, a second such memory device can be placed on a second surface of the circuit board and coupled to a second plurality of signal lines of the circuit board through its respective data contacts such that the first memory device is directly over the second memory device and such that no data contact of the first memory device is directly over a data contact of the second memory device.

7. The memory device as recited in claim 5, the package further includes a plurality of strobe contacts being arranged such that when a first such memory device is positioned on a first surface of a circuit board and coupled to a first plurality of strobe lines of the circuit board through its respective strobe contacts, a second such memory device can be placed on a second surface of the circuit board and coupled to a second plurality of strobe lines of the circuit board through its respective strobe contacts such that the first memory device is directly over the second memory device and such that no strobe contact of the first memory device is directly over a strobe contact of the second memory device.

8. The memory device as recited in claim 5, wherein the package further includes a plurality of address contacts for coupling the memory device to address signal lines, the address contacts being arranged such that when a first such memory device is positioned on a first surface of a circuit board, a second such memory device can be placed on a second surface of the circuit board such that the first memory device is directly over the second memory device and such that each address contact of the first memory device is directly over an address contact of the second memory device.

9. The memory device as recited in claim 5, wherein the data contacts are further arranged such that the data contacts of the first memory device is directly over an area of the second memory device not occupied by data contacts.

10. The memory device as recited in claim 5, wherein the integrated circuit memory chip is a dynamic point-to-point memory chip having at least first and second sets of memory cells configurable between a wide mode and a narrow mode, the memory chip outputting data from the first set of memory cells through a first portion of the plurality of data pads and outputting data from the second set of memory cells through a second portion of the plurality of data pads in the wide mode, the memory chip outputting data from the first and second sets of memory cells through the first portion of the plurality of data pads in the narrow mode, the memory chip being set to operate in the narrow mode.

11. A memory system, comprising:
 a circuit board having a top surface and a bottom surface, each of the top surface and bottom surface including at least one data contact and at least one strobe contact, wherein no data contact of the top surface is coupled to a data contact of the bottom surface and no strobe contact of the top surface is coupled to a strobe contact of the bottom surface;
 a first memory device and a second memory device, each of the first memory device and second memory device having a surface that includes at least one data contact and at least one strobe contact, the first memory device being secured to the top surface of the circuit board such that the data contact(s) and strobe contact(s) of the first memory device mate with respective ones of the data contact(s) and strobe contact (s) of the top surface of the circuit board, the second memory device being secured to the bottom surface of the circuit board such that the data contact(s) and strobe contact(s) of the second memory device mate with respective ones of the data contact (s) and strobe contact (s) of the bottom surface of the circuit board, the data contact(s) of the first memory device being over an area in the surface of the second memory device not occupied by any the data contact of the second memory device.

12. The memory system as recited in claim 8, wherein the circuit board includes a plurality of signal lines between the top and the bottom surfaces and a plurality of back-drilled vias having via bottoms connected to respective ones of the signal lines, and wherein the data contacts of the first and second memory devices are coupled to respective data signal lines through respective ones of the back-drilled vias.

\* \* \* \* \*